United States Patent [19]

Ogawa

[11] Patent Number: 4,574,202
[45] Date of Patent: Mar. 4, 1986

[54] RECTIFIER CIRCUIT WITH ATTACK TIME VARIABLE IN RESPONSE TO AN INPUT SIGNAL LEVEL

[75] Inventor: Atsushi Ogawa, Yokohama, Japan

[73] Assignee: Tokyo Shibaura Denki Kabushiki Kaisha, Japan

[21] Appl. No.: 434,485

[22] Filed: Oct. 15, 1982

[30] Foreign Application Priority Data

Oct. 15, 1981 [JP] Japan .................. 56-164705

[51] Int. Cl.⁴ .................. H03K 5/153; H03K 5/00
[52] U.S. Cl. .................. 307/261; 307/246; 307/263; 307/360; 307/602; 328/26
[58] Field of Search .............. 307/246, 261, 263, 360, 307/361, 602, 260; 328/26; 330/141, 281

[56] References Cited

U.S. PATENT DOCUMENTS

| 2,924,769 | 2/1960 | Harriman et al. | |
| 3,775,705 | 11/1974 | Dolby | 333/14 |
| 4,292,598 | 9/1981 | Yasumura | 330/141 |

FOREIGN PATENT DOCUMENTS

| 1120010 | 12/1961 | Fed. Rep. of Germany . |
| 1945347 | 3/1971 | Fed. Rep. of Germany . |
| 2364733 | 10/1975 | Fed. Rep. of Germany . |
| 522799 | 6/1940 | United Kingdom . |
| 613530 | 11/1948 | United Kingdom . |
| 807780 | 1/1959 | United Kingdom . |
| 1102403 | 2/1968 | United Kingdom . |
| 1120541 | 7/1968 | United Kingdom . |
| 1424082 | 2/1976 | United Kingdom . |
| 1436627 | 5/1976 | United Kingdom . |

Primary Examiner—John Zazworsky
Attorney, Agent, or Firm—Finnegan, Henderson, Farabow, Garrett & Dunner

[57] ABSTRACT

A signal rectifier circuit with attack time changeable in response to an input signal level is disclosed which has a plurality of current transmitting paths connected in parallel between an input terminal and an output terminal. There is also provided a rectifier in every signal transmitting path or a circuit between the output terminal and the parallel circuit of the signal transmitting paths. A capacitor in combination with resistance components involved in the respective signal transmitting paths provides a signal smoothing operation. The signal transmitting paths are given different offset voltages which allow the attack time of the smoothing operation to vary as a function of the input signal level.

15 Claims, 8 Drawing Figures

RECTIFIER CIRCUIT WITH ATTACK TIME VARIABLE IN RESPONSE TO AN INPUT SIGNAL LEVEL

FIELD OF THE INVENTION

This invention relates to a signal rectifier circuit, and more particularly, to a signal rectifier circuit which has an attack time changeable in response to the input signal level.

BACKGROUND OF THE INVENTION

Signal rectifier circuits are commonly used for level sensors responsive to an input signal's level in prior art electric or electronic equipment. For example, noise reduction circuits or automatic recording level control circuits in audio or video tape players use this sort of signal rectifier circuit.

Signal rectifier circuits operate to rectify an AC input signal, for example, an audio or video frequency signal, to a D.C. signal. As is well-known, ripple components of the D.C. signal are reduced by passing the D.C. signal through a smoothing circuit. The time constant of the smoothing circuit is automatically shortened when a high level signal is suddenly inputted, so that the attack time or the compliance of the circuit to the high level signal is improved.

In a conventional signal rectifier circuit, for example, the control circuit in FIG. 3 of U.S. Pat. No. 3,775,705, the smoothing circuit has a first RC smoothing network formed by a resistor and a capacitor with a relatively short time constant. A second network comprising a series resistor and a shunt capacitor follows the first network and a diode with some forward voltage drop is connected in parallel with the series resistor. The series resistor in the second network is shunted by the diode when, for large increases in signal amplitude, the diode conducts. The time constant of the smoothing circuit is thereby reduced. However, such a conventional rectifier circuit is defective in that the threshold level of the input signal necessary for the time constant change is fixed to the forward voltage drop of the diode, for example, with a silicon diode about 0.7 volts. In other words, it is very difficult to select a different threshold level. Moreover, formation of two capacitors in such a prior art circuit is difficult when the signal rectifier circuit is manufactured in the form of an integrated circuit.

SUMMARY OF THE INVENTION

Accordingly, an object of the present invention is to provide a signal rectifier circuit with an attack time changeable in response to an input signal level, in which the threshold level of the input signal for the attack time change is able to be designed to an unrestricted value.

A further object of the present invention is to provide a signal rectifier circuit with an attack time changeable in response to an input signal level, which is easy to manufacture in form of an integrated circuit.

These and other objects according to the present invention in one aspect are achieved in a circuit configured as follows: an input terminal for receiving the input signal; an output terminal; capacitor means connected between the output terminal and a reference potential terminal; a first means for rectifying said input signal connected between the input terminal and the output terminal, the first rectifying means including a first means for determining a first time constant together with the capacitor means; a second means for rectifying the input signal connected in parallel with the first rectifying means, the second rectifying means including a second means for determining a second time constant together with the capacitor means; and means for applying an offset voltage level to one of the first and second rectifying means.

Additional objects and advantages of the present invention will become apparent to persons skilled in the art from a study of the following description of the accompanying drawings, in which:

DESCRIPTION OF THE PREFERRED EMBODIMENT

Figure 1:
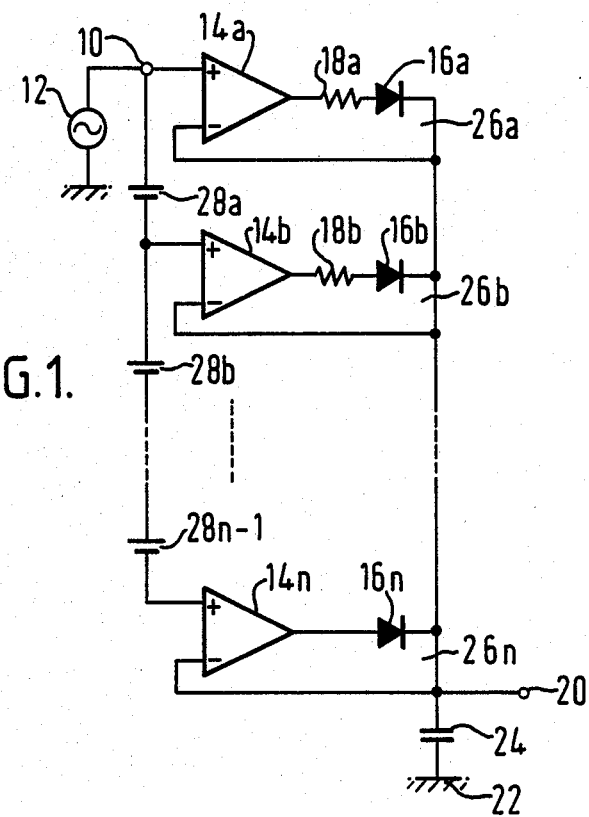
FIG. 1 shows a circuit diagram of a basic construction of the signal rectifier circuit according to the present invention.

Referring to FIG. 1, there is shown a circuit diagram of a basic construction of the signal rectifier circuit according to this invention. Input terminal 10 is provided for receiving an AC input signal, like an audio frequency signal or a video frequency signal. The reference 12 represents the AC signal source. Operational amplifier 14a is directly coupled at its non-inverted input to input terminal 10. An output of the operational amplifier 14a is connected to an input of a rectifier 16a, for example, a diode, via resistor 18a. An output of rectifier 16a is connected to output terminal 20. Output terminal 20 is connected to an inverted input of operational amplifier 14a and reference potential terminal 22 through capacitor 24. A combination of operational amplifier 14a, resistor 18a and rectifier 16a forms first rectifier circuit 26a. A combination of resistor 18a and capacitor 24 serves as a first smoothing circuit with a time constant defined by the resistance of resistor 18a and the capacitance of capacitor 24.

A second rectifier circuit 26b similar to rectifier circuit 26a is connected in parallel with rectifier circuit 26a. A non-inverted input of an operational amplifier 14b is coupled to input terminal 10 via offset voltage source 28a. Offset voltage source 28a may for example, comprise a battery with a given voltage. An inverted input of operational amplifier 14b and an output of rectifier 16b are both connected to output terminal 20. A combination of resistor 18b and capacitor 24 serves as a second smoothing circuit with a time constant defined by the resistance of resistor 18b and the capacitance of capacitor 24.

In the same manner, a given number of rectifier circuits 26a, 26b . . . 26n are shown connected in parallel between input terminal 10 and output terminal 20. However, non-inverted inputs of operational amplifiers on and after operational amplifier 14a are each respectively coupled to input terminal 10 through offset voltage sources 28a, 28b . . . 28n−1. Each non-inverted input is, accordingly, at a different voltage. In one aspect for applying these different voltages, non-inverted inputs of respective operational amplifiers 14b, 14c . . . 14n are coupled to non-inverted inputs of operational amplifiers 14a, 14b . . . 14n−1, respectively, via respective offset voltage sources 28a, 28b . . . 28n−1 as shown in FIG. 1. Offset voltage sources 28a, 28b . . . 28n−1 may each have the same or different voltages. In another aspect for applying the different voltages, non-inverted inputs of operational amplifiers, 14b, 14c . . . 14n are individually coupled to input terminal 10 via offset voltage sources which each has a different voltage.

The operation of the circuit of FIG. 1 is as follows: When the AC input signal is so small as not to exceed the voltage of offset voltage source 28a, the AC input signal is rectified by only first rectifier circuit 26a. Therefore, the rectified signal is smoothed with a relatively long time constant. When the AC input signal increases so as to exceed the voltage of offset voltage source 28a, both first and second rectifier circuit 26a and 26b operate to rectify the AC input signal. In this state, the smoothing operation for the rectified signal is accomplished by capacitor 24 and two parallel resistors 18a and 18b. Accordingly, the time constant in this state is reduced so that the circuit becomes easy to be compliant with a relatively larger AC input signal. Similarly, some number of rectifier circuits operate in parallel to rectify the AC input signal according to the amplitude of the AC input signal. Then the time constant of the smoothing circuit is reduced even more. Therefore, the rectifier circuit shown in FIG. 1 is able to rectify the AC input signal with compliance proper to the amplitude of the AC input signal. Moreover, the offset voltages are easily set to different values, and are not limited to a specific voltage like the forward voltage drop of a diode.

Figure 2:
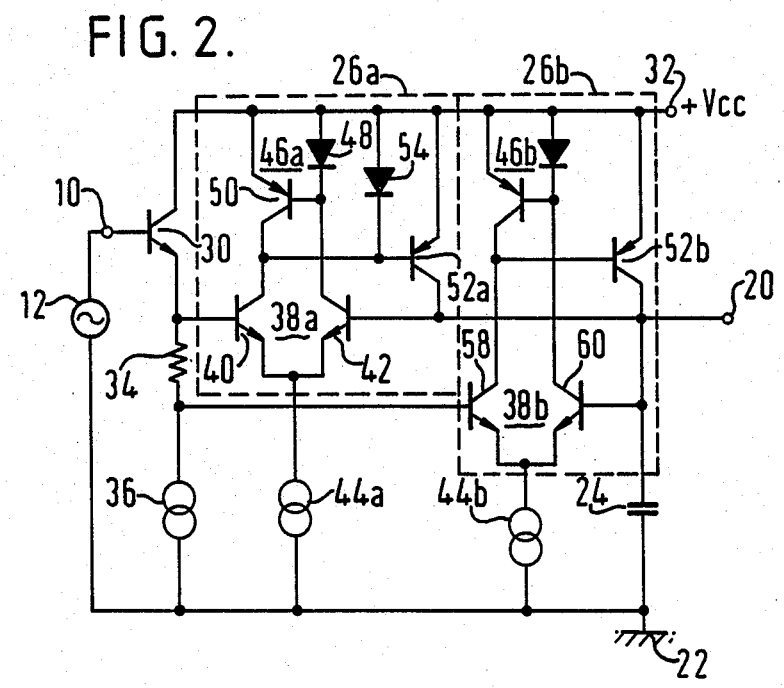
FIG. 2 shows a circuit diagram of one embodiment of the present invention.

Referring now to FIG. 2, there is shown an embodiment of the circuit of FIG. 1. In FIG. 2, input terminal 10 is coupled to the base of transistor 30. Transistor 30 is connected at its collector to voltage source 32, and at its emitter to reference potential terminal 22 through the series circuit of resistor 34 and constant current source 36. The emitter of transistor 30 is also connected to output terminal 20 through first rectifier circuit 26a.

Rectifier circuit 26a in FIG. 2 is shown to have a differential amplifier 38a corresponding to operational amplifier 14a of FIG. 1. Differential amplifier 38a comprises a pair of transistors 40 and 42 having emitters connected to each other. The common connected emitters are coupled to constant current source 44a which, in turn, is coupled to reference potential terminal 22. The base of transistor 40 is connected to the emitter of transistor 30, while the base of transistor 42 is connected to output terminal 20.

An active load 46a of rectifier circuit 26a is connected between voltage source 32 and the collectors of the pair of transistors 40 and 42. Active load 46a is formed in a current mirror configuration by diode 48 connected between voltage source 32 and the collector of transistor 42 and by transistor 50 having an emitter connected to voltage source 32, a collector connected to the collector of transistor 40 and a base connected to the connection between diode 48 and transistor 42.

The collector of transistor 40 of differential amplifier 38a is connected to output terminal 20 through recitifying transistor 52a having an emitter connected to voltage source 32, a base connected to the collector of transistor 40 and a collector connected to output terminal 20. Rectifying transistor 52a is formed in a current mirror configuration. Diode 54 is connected between voltage source 32 and the base of transistor 52a. Capacitor 24 is connected between output terminal 20 and reference potential terminal 22.

In the same manner, second rectifier circuit 26b, including a differential amplifier 38b comprising transistors 58 and 60, is connected in parallel with first rectifier circuit 26a. Differential amplifier 38b connected to the connection between resistor 34 and constant current source 36. An active load 46b is connected between differential amplifier 38b and voltage source 32. Rectifying transistor 52b, has a base connected between active load 46b and differential amplifier 38b and has a collector-emitter path connected between source 32 and output terminal 20.

The operation of the circuit of FIG. 2 is similar to the operation of the circuit of FIG. 1. An offset voltage for second rectifier circuit 26b is given by a voltage drop across resistor 34. The voltage drop is governed by the resistance of resistor 34 and the current flowing through constant current source 36. When only first rectifier circuit 26a operates to rectify an AC input signal of small amplitude a smoothing operation for the input signal is performed by the combination of capacitor 24 and an equivalent resistance of constant current source 44a. On the other hand, when both first and second rectifier circuits 26a and 26b operate to rectify an AC input signal of relatively large amplitude, the smoothing operation is performed by a combination of capacitor 24 and both equivalent resistances of common constant current sources 44a and 44b in parallel. Therefore, the time constant of the smoothing operation becomes shorter when both rectifier circuits 26a and 26b operate.

Figure 3A:
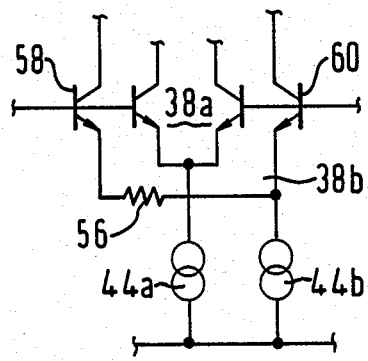
FIGS. 3a, 3b, 3c and 3d are modifications of the offset voltage sources of FIG. 2.

FIGS. 3a, 3b, 3c and 3d show varieties of offset voltage sources. In FIG. 3a, resistor 56 is connected between emitters of a pair of transistors 58 and 60 of differential amplifier 38b. Therefore, transistor 58 is given an offset voltage defined by the voltage drop across resistor 56.

Figure 3B:
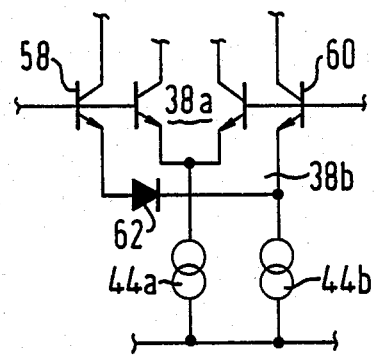

In FIG. 3b, diode 62 is connected in place of resistor 56 of FIG. 3a. Therefore, transistor 58 is given an offset voltage of the diode's forward voltage drop, for example; with a silicon diode about 0.7 volts.

Figure 3C:
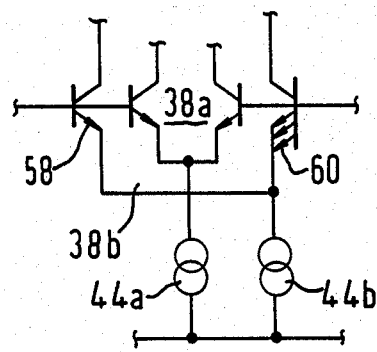

In FIG. 3c, transistor 60 on the inverted input side of differential amplifier 38b has a base-emitter junction area greater than that of transistor 58 of the non-inverted input side. Due to the difference of the base-emitter junction areas of transistors 58 and 60, current flowing through transistor 58 is suppressed. This causes an offsetting in voltage to transistor 58. For example, the base-emitter junction area ratio of 4 times produces about 36 mV offset.

Figure 3D:
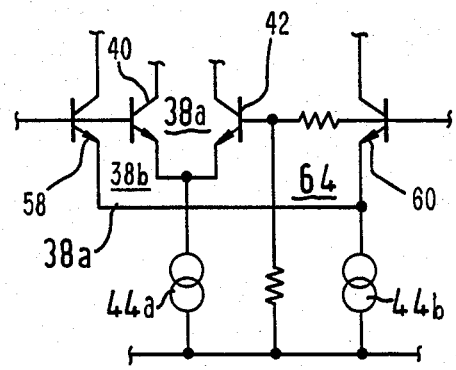

In FIG. 3d, the base of transistor 42 on the inverted input side of differential amplifier 38a is connected to output terminal 20 (not shown) via a voltage divider 64. Due to differential amplifier 38a having applied to its inverted input a voltage lower than that to differential amplifier 38b, differential amplifier 38b becomes less active compared with differential amplifier 38a. This causes an offsetting in operation of differential amplifier 38b.

Figure 4:
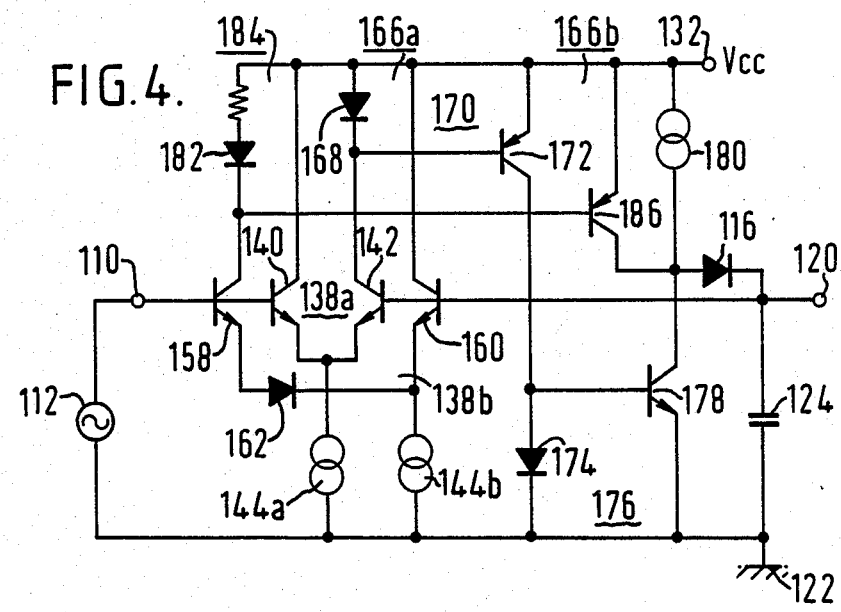
FIG. 4 shows a circuit diagram of another embodiment of the present invention.

Referring now to FIG. 4, there is shown another embodiment of this invention. Input terminal 110 is coupled to rectifier means 116 through signal transmitting path 166a. Signal transmitting path 166a includes a differential amplifier 138a comprising transistors 140 and 142, a constant current source 144a, a current mirror 170 comprising diode 168 and transistor 172, a current mirror 176 comprising diode 174 and transistor 178, and a constant current source 180. Transistors 140 and 142 have emitters connected to each other and a constant current source 144a connected between the emitters and reference potential terminal 122. Transistor 140 is connected at its base to input terminal 110 and at its collector to voltage source 132 directly, while transistor 142 is connected at its base to output terminal 120 and at its collector to voltage source 132 through diode 168. Diode 168 is connected in a form of current mirror 170 together with transistor 172. Transistor 172 is connected at its base to the connection between diode 168 and transistor 142 and at its emitter to voltage source 132 and at its collector to reference potential terminal 122 through diode 174. Diode 174 is also connected in a form of another current mirror 176 together with transistor 178. Transistor 178 is connected at its base to the connection between transistor 172 and diode 174, at its emitter to reference potential terminal 122 and at its collector to voltage source 132 through constant current source 180. The connection between transistor 178 and constant current source 180 is connected to rectifier 116. Capacitor 124 is connected between output terminal 120 and reference potential terminal 122.

Signal transmitting path 166b is connected between input terminal 110 and rectifier 116 in parallel with signal transmitting path 166a. Signal transmitting path 166b includes differential amplifier 138b comprising transistors 150, 160, current mirror 184 comprising diode 182 and transistor 186, and a constant current source 144b. Transistors 158 and 160 have emitters connected to each other through diode 162 and a constant current source 144b connected between reference potential terminal 122 and the connection between diode 162 and transistor 160. Transistor 158 is connected at its base to input terminal 110 and at its collector to voltage source 132 through diode 182. Diode 182 is connected in the form of current mirror 184 together with transistor 186. Transistor 160 is connected at its base to output terminal 120 and at its collector to voltage source 132 directly. Transistor 186 is connected at its base to the connection between diode 182 and transistor 158, at its emitter to voltage source 132 and at its collector to rectifier 116.

The operation of the circuit of FIG. 4 is as follows: When an AC input signal of small amplitude is applied to input terminal 110, differential amplifier 138a is activated. A current flowing through transistor 142 varies in inverse proportion to the input signal. This current causes the same amount of current in transistor 178 due to the two stages of current mirrors 170 and 176. The current of transistor 178 is extracted from the constant current of constant current source 180. The rest of the constant current flows into rectifier 116. Therefore, current in proportion to the input signal flows into rectifier 116 and is rectified thereby. The rectified signal is smoothed by a combination of capacitor 124 and an equivalent resistance of constant current source 180.

When an AC input signal of relatively large amplitude exceeding an offset voltage given by diode 162 is applied to input terminal 110, differential amplifier 138b is also activated. Current flowing through transistor 158 varies in proportion to the input signal. This current causes the same amount current in transistor 186 due to current mirror 184. The current of transistor 186 flows into rectifier 116. Therefore, a current in proportion to the input signal flows into rectifier 116 and is rectified, in addition to the current due to signal transmitting path 166a. In this case, the smoothing operation is performed by capacitor 124 and the equivalent resistance of constant current source 144b and constant current source 180 in parallel. Accordingly, the time constant of the smoothing operation is reduced. In other words, the attack time of the circuit for the input signal is reduced.

Figure 5:
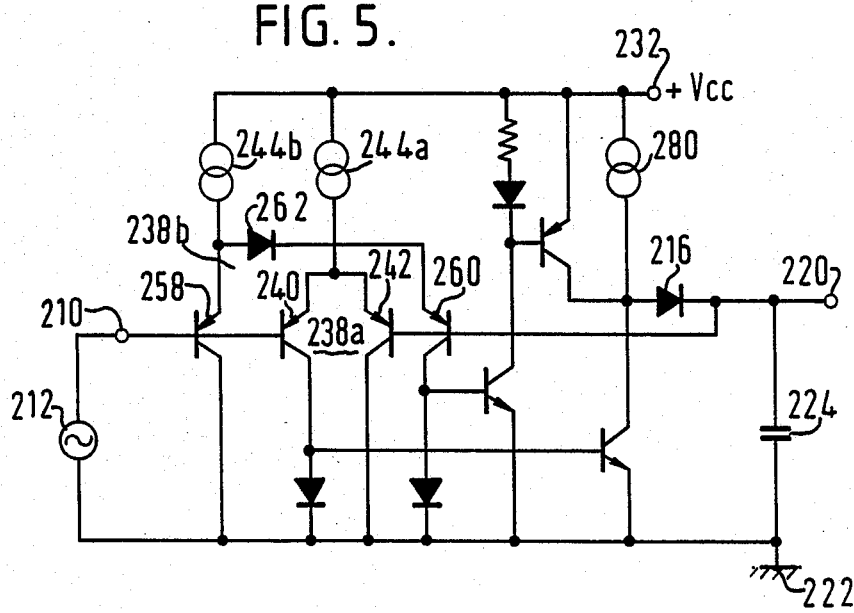
FIG. 5 shows a modification of the circuit of FIG. 4.

FIG. 5 is a modification of the circuit shown in FIG. 4. In FIG. 5, differential amplifiers 238a and 238b are formed by PNP transistors as opposed to NPN transistors in the differential amplifiers 138a and 138b of FIG. 4. Except for the resultant change in polarity, the circuit of FIG. 5 is essentially the same as the circuit of FIG. 4.

What is claimed is:

1. A signal rectifier circuit with attack time changeable in response to an input signal level comprising:
   an input terminal for receiving said input signal;
   an output terminal;
   capacitor means connected between said output terminal and a reference potential terminal;
   first means for rectifying said input signal having an input signal current path connected between said input terminal and said output terminal for delivering said input signal, in rectified form, to said output terminal, said first rectifying means including first means for determining a first time constant together with said capacitor means;
   second means for rectifying said input signal having an input signal current path connected in parallel with said input signal current path of said first rectifying means for delivering said input signal, in rectified form, to said output terminal, said second rectifying means including second means for determining a second time constant together with said capacitor means;
   means for applying an offset voltage to one of said first and second rectifying means; and wherein
   said first and second rectifying means include peak detector circuits.

2. A signal rectifier circuit according to claim 1, wherein said first and second rectifying means each comprise a differential amplifier and said peak detector circuits each comprise rectifier means.

3. A signal rectifier circuit according to claim 2, wherein said offset voltage applying means is a battery.

4. A signal rectifier circuit according to claim 2, wherein said offset voltage applying means is a resistor connected to a constant current source.

5. A signal rectifier circuit according to claim 2, wherein one of said differential amplifiers includes transistors and wherein said offset voltage applying means is a resistor connected between emitters of said transistors.

6. A signal rectifier circuit according to claim 2, wherein one of said differential amplifiers includes transistors and wherein said offset voltage applying means is a diode connected between emitters of said transistors.

7. A signal rectifier circuit according to claim 2, wherein one of said differential amplifiers comprises first and second transistors and wherein said offset voltage applying means has a greater base-emitter junction area in said first transistor in comparison to the base-emitter junction area of said second transistor.

8. A signal rectifier circuit according to claim 3, wherein said offset voltage applying means is a voltage divider connected to said output terminal to supply a portion of the output voltage developed at said output terminal to an inverted input of one of said differential amplifiers.

9. A signal rectifier circuit with attack time changeable in response to an input signal level comprising:
   an input terminal for receiving said input signal;

an output terminal;
capacitor means connected between said output terminal and a reference potential terminal;
means for rectifying said input signal, said means for rectifying having an output connected to said output terminal;
first means for transmitting said input signal connected between said input terminal and an input of said rectifying means, said first transmitting means including a first means for determining a first time constant together with said capacitor means;
second means for transmitting said input signal connected in parallel with said first transmitting means, said second transmitting means including second means for determining a second time constant together with said capacitor means; and
a battery for applying an offset voltage level to one of said first and second transmitting means.

10. A signal rectifier circuit according to claim 9, wherein said first and second signal transmitting means respectively comprise differential amplifiers.

11. A signal rectifier circuit with attack time changeable in response to an input signal level comprising:
an input terminal for receiving said input signal;
an output terminal;
capacitor means connected between said output terminal and a reference potential terminal;
means for rectifying said input signal, said means for rectifying having an output connected to said output terminal;
first means for transmitting said input signal connected between said input terminal and an input of said rectifying means, said first transmitting means including a first means for determining a first time constant together with said capacitor means;
second means for transmitting said input signal connected in parallel with said first transmitting means, said second transmitting means including second means for determining a second time constant together with said capacitor means; and
a resistor connected to a constant current source for applying an offset voltage level to one of said first and second transmitting means.

12. A signal rectifier circuit with attack time changeable in response to an input signal level comprising:
an input terminal for receiving said input signal;
an output terminal;
capacitor means connected between said output terminal and a reference potential terminal;
means for rectifying said input signal, said means for rectifying having an output connected to said output terminal;
first means for transmitting said input signal connected between said input terminal and an input of said rectifying means, said first transmitting means including a first differential amplifier and first means for determining a first time constant together with said capacitor means;
second means for transmitting said input signal connected in parallel with said first transmitting means, said second transmitting means including a second differential amplifier and second means for determining a second time constant together with said capacitor means; and
means for applying an offset voltage level to one of said first and second transmitting means, wherein one of said first and second differential amplifiers includes transistors and wherein said offset voltage applying means is a resistor connected between emitters of said transistors.

13. A signal rectifier circuit with attack time changeable in response to an input signal level comprising:
an input terminal for receiving said input signal;
an output terminal;
capacitor means connected between said output terminal and a reference potential terminal;
means for rectifying said input signal, said means for rectifying having an output connected to said output terminal;
first means for transmitting said input signal connected between said input terminal and an input of said rectifying means, said first transmitting means including a first differential amplifier and first means for determining a first time constant together with said capacitor means;
second means for transmitting said input signal connected in parallel with said first transmitting means, said second transmitting means including a second differential amplifier and second means for determining a second time constant together with said capacitor means; and
means for applying an offset voltage level to one of said first and second transmitting means, wherein one of said differential amplifiers includes transistors and wherein said offset voltage applying means is a diode connected between emitters of said transistors.

14. A signal rectifier circuit with attack time changeable in response to an input signal level comprising:
an input terminal for receiving said input signal;
an output terminal;
capacitor means connected between said output terminal and a reference potential terminal;
means for rectifying said input signal, said means for rectifying having an output connected to said output terminal;
first means for transmitting said input signal connected between said input terminal and an input of said rectifying means, said first transmitting means including a first differential amplifier and first means for determining a first time constant together with said capacitor means;
second means for transmitting said input signal connected in parallel with said first transmitting means, said second transmitting means including a second differential amplifier and second means for determining a second time constant together with said capacitor means; and
means for applying an offset voltage level to one of said first and second transmitting means, wherein one of said first and second differential amplifiers comprises first and second transistors and wherein said offset voltage applying means has a greater base-emitter junction area in said first transistor in comparison to the base-emitter junction area of said second transistor.

15. A signal rectifier circuit with attack time changeable in response to an input signal level comprising:
an input terminal for receiving said input signal;
an output terminal;
capacitor means connected between said output terminal and a reference potential terminal;
means for rectifying said input signal, said means for rectifying having an output connected to said output terminal;

first means for transmitting said input signal connected between said input terminal and an input of said rectifying means, said first transmitting means including a first differential amplifier and first means for determining a first time constant together with said capacitor means;

second means for transmitting said input signal connected in parallel with said first transmitting means, said second transmitting means including a second differential amplifier and second means for determining a second time constant together with said capacitor means; and means for applying an offset voltage level to one of said first and second transmitting means, wherein said offset voltage applying means is a voltage divider connected to said output terminal to supply a portion of the output voltage developed at said output terminal to an inverted input of one of said first and second differential amplifiers.

* * * * *